(12) United States Patent
Lalanne et al.

(10) Patent No.: US 9,923,016 B2
(45) Date of Patent: Mar. 20, 2018

(54) HIGH-DYNAMIC-RANGE PIXEL

(71) Applicant: STMicroelectronics (Crolles 2) SAS, Crolles (FR)

(72) Inventors: Frédéric Lalanne, Bernin (FR); Pierre Emmanuel Marie Malinge, La Tessoualle (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/160,811

(22) Filed: May 20, 2016

(65) Prior Publication Data

US 2017/0186806 A1 Jun. 29, 2017

(30) Foreign Application Priority Data

Dec. 29, 2015 (FR) ..................... 15 63434

(51) Int. Cl.
*H01L 27/146* (2006.01)
*H04N 5/3745* (2011.01)
*H04N 5/355* (2011.01)

(52) U.S. Cl.
CPC .. *H01L 27/14656* (2013.01); *H01L 27/14603* (2013.01); *H01L 27/14636* (2013.01); *H04N 5/3745* (2013.01); *H04N 5/37452* (2013.01); *H01L 27/146* (2013.01); *H01L 27/1463* (2013.01); *H01L 27/14609* (2013.01); *H04N 5/3559* (2013.01)

(58) Field of Classification Search
CPC .. H04N 5/369; H04N 5/35563; H01L 27/146; H01L 27/601; H01L 27/14603; H01L 27/14609; H01L 27/14636
See application file for complete search history.

(56) References Cited

U.S. PATENT DOCUMENTS

| 8,513,761 | B2 | 8/2013 | Roy et al. | |
| 2004/0041932 | A1 | 3/2004 | Chao et al. | |
| 2014/0263947 | A1* | 9/2014 | Dierickx | H01L 27/14609 250/206 |

FOREIGN PATENT DOCUMENTS

JP 2012058522 A 3/2012

OTHER PUBLICATIONS

Akahane, N. et al., "A Sensitivity and Linearity Improvement of a 100-dB Dynamic Range CMOS Image Sensor Using a Lateral Overflow Integration Capacitor," IEEE Journal of Solid-State Circuits 41(4):851-858, Apr. 2006.

* cited by examiner

*Primary Examiner* — Ermias Woldegeorgis
(74) *Attorney, Agent, or Firm* — Seed IP Law Group LLP

(57) ABSTRACT

A pixel including a photodiode having a first pole coupled through a transfer MOS transistor to a node for sensing charges of a first type stored in the photodiode, and having a second pole connected to a storage capacitor and to a circuit for reading charges of a second type sent to the storage capacitor.

19 Claims, 4 Drawing Sheets

HIGH-DYNAMIC-RANGE PIXEL

BACKGROUND

Technical Field

The present disclosure relates to a high-dynamic-range pixel, that is, a pixel capable of providing a signal representative of the light for a wide range of light intensity levels.

Discussion of the Related Art

FIG. 1 is a copy of FIG. 1 of U.S. Pat. No. 8,513,761 (B9164) of the applicant and schematically illustrates an example of an image sensor pixel circuit.

The pixel comprises a photodiode D having a first pole, here the anode, connected to ground GND, and having a second pole, here the cathode, coupled to a sense node S by a transfer N-channel MOS transistor TR. Sense node S is coupled to a high reference potential, for example, power supply potential Vdd, by a precharge MOS transistor RST. Pixel 1 is associated with a read circuit of node S comprising a MOS transistor SF, assembled as a source follower, and a selection MOS transistor RD. The gate of transistor SF is connected to node S, the drain of transistor SF is connected to power supply potential Vdd, and the source of transistor SF is connected to the drain of transistor RD, the source of transistor RD being connected by a terminal P of a processing circuit (not shown). It should be noted that a plurality of pixels, currently four pixels, may be associated with a same read circuit. Generally, the gate control signals of transistors RD, RST, and TR are provided by control circuits, not shown in FIG. 1.

In operation, during an illumination phase, or integration phase, transfer transistor TR is set to the non-conductive state. The light received by the pixel causes the generation of electron-hole pairs in photodiode D, the electrons being stored in the photodiode. During a read phase, precharge transistor RST, initially in the on state, is set to the non-conductive state. The potential of node S is then substantially equal to Vdd. Transistor TR is then set to the on state and then to the off state, which causes the transfer of the photogenerated electrons stored in photodiode D to sense node S. The potential variation of sense node S resulting from the electron transfer is read by the associated read circuit and the quantity of light received by this pixel during the integration phase is deduced therefrom.

The dynamic range of the pixel of FIG. 1 corresponds to the maximum quantity of light that the pixel can detect. Such a maximum quantity of light depends on the maximum quantity of electrons that photodiode D can store, and thus, in particular, on the dimensions of photodiode D. Thus, when pixels of relatively smaller dimensions are desired to be formed, the dimensions of photodiode D are decreased, which results in a decrease in the pixel dynamic range.

It would thus be desirable to have a pixel enabling to store more photogenerated charges than a pixel of the type of that in FIG. 1. It would also be desirable for this larger storage capacity not to require increasing the pixel dimensions.

BRIEF SUMMARY

Thus, an embodiment provides a pixel comprising a photodiode having a first pole coupled by a transfer MOS transistor to a node for sensing charges of a first type stored in the photodiode, and having a second pole connected to a storage capacitor and to a circuit for reading charges of a second type sent towards the storage capacitor.

According to an embodiment, the second pole of the photodiode is further connected to a reset MOS transistor.

According to an embodiment, the sense node is coupled to a precharge MOS transistor.

According to an embodiment, the first pole of the photodiode is connected to an anti-blooming MOS transistor.

According to an embodiment, the read circuit comprises a coupling capacitor connected between the second pole of the photodiode and the sense node.

According to an embodiment, the read circuit comprises a coupling capacitor and a decoupling capacitor, series-connected, the coupling capacitor being connected to the second pole of the photodiode and the decoupling transistor being connected to the sense node.

According to an embodiment, the read circuit comprises a read MOS transistor, the storage capacitor being connected between the second pole of the photodiode and the gate of the read MOS transistor.

According to an embodiment, the photodiode comprises a first region of a first conductivity type formed in an insulated semiconductor well of the second conductivity type, the well being laterally delimited by a conductive wall coated with an insulating layer;

the storage capacitor comprises the conductive wall, the insulating layer, and the well;

a second heavily-doped region of the second conductivity type is formed at the level of a surface of the well and is connected to the circuit for reading charges of the second type;

a third heavily-doped region of the first conductivity type is formed at the level of said surface of the well and is connected to the sense node; and the gate of the transfer transistor is formed on said surface of the well and is capable of receiving or not a potential to allow or block a transfer of charges of the first type from the first region to the third region.

According to an embodiment, an interconnection structure is formed on said surface of the well, the coupling capacitor being formed in the interconnection structure.

According to an embodiment, the well is delimited on its lower surface side by another insulating layer.

The foregoing and other features and advantages will be discussed in detail in the following non-limiting description of specific embodiments in connection with the accompanying drawings.

DETAILED DESCRIPTION

Figure 1:
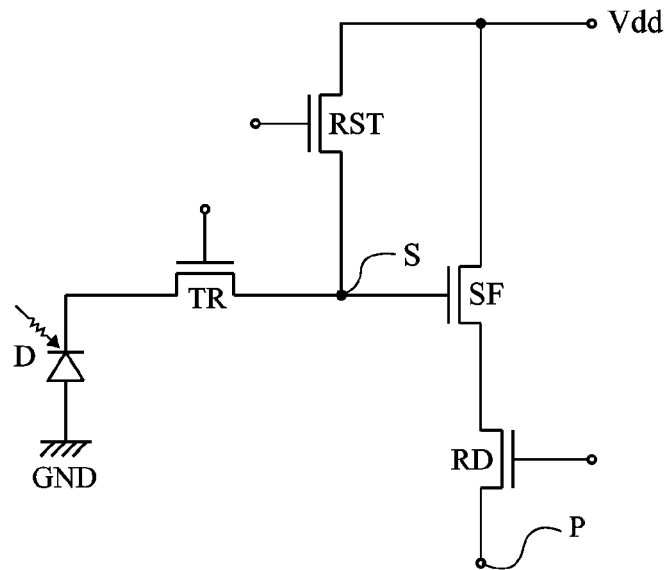
FIG. 1, previously described, illustrates an example of a pixel circuit.

The same elements have been designated with the same reference numerals in the various drawings and, further, the various drawings are not to scale. For clarity, only those elements which are useful to the understanding of the described embodiments have been shown and are detailed.

In the following description, terms "front", "back", "top", "under", "on", "upper", "lower" refer to the orientation of the concerned elements in the corresponding drawings. Unless otherwise specified, expressions "in the order of" and "substantially" mean to within 10%, preferably to within 5%. Further, unless otherwise indicated, two elements will be called "connected" when they are directly electrically connected to each other, and will be called "coupled" when they are connected to each other via another component such as a transistor or a capacitor.

Figure 2:
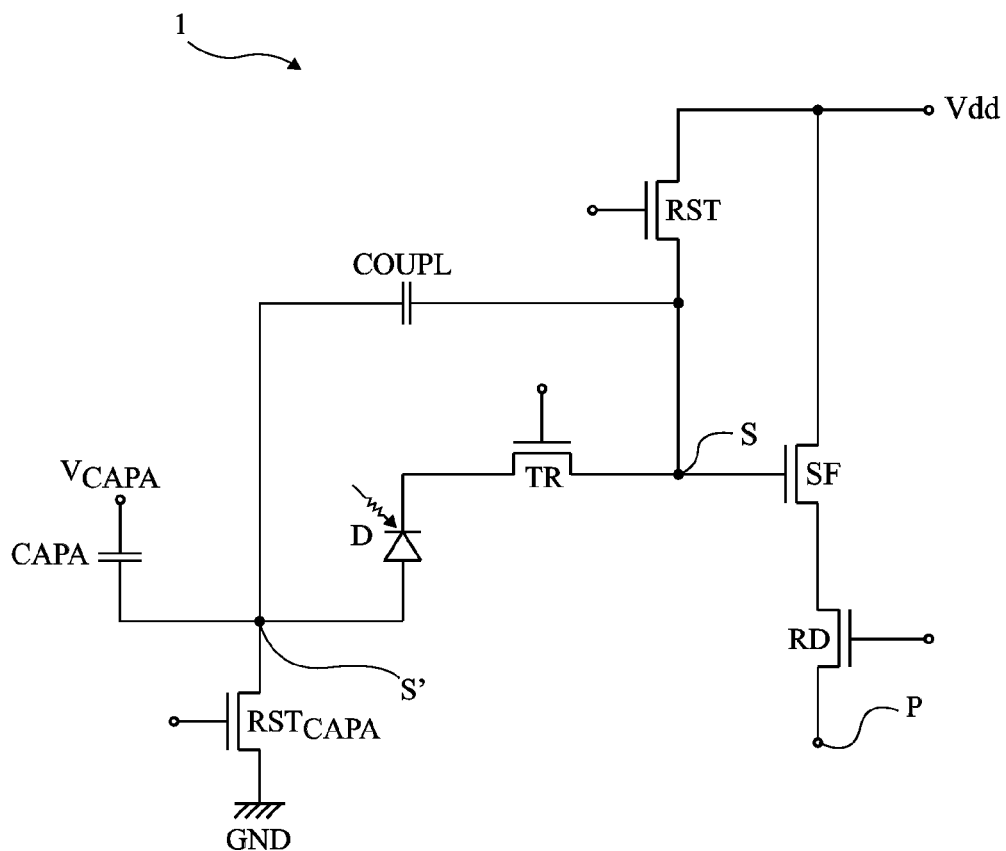
FIG. 2 illustrates an embodiment of a high-dynamic-range pixel circuit.

FIG. 2 illustrates an embodiment of a circuit of a high-dynamic-range pixel 1.

Like the pixel of FIG. 1, pixel 1 comprises a precharge transistor RST connected between a sense node S and a power supply potential Vdd, and a photodiode D having its cathode coupled to sense node S by a transfer MOS transistor TR. Pixel 1 is also associated with a read circuit for reading node S, the read circuit comprising a source follower MOS transistor SF and a selection MOS transistor RD. Transistors TR, RD, RST, and SF are connected to one another and to power supply and ground potentials Vdd and GND in the same way as in the pixel of FIG. 1.

Unlike the pixel of FIG. 1, in pixel 1, the anode of photodiode D is connected to a charge storage node S'. A storage capacitor CAPA has a terminal or electrode directly connected to node S', and another terminal or electrode connected to a negative potential $V_{CAPA}$, for example, −1 V. Storage node S' is coupled to a low reference potential, for example, ground GND, via a reset N-channel MOS transistor $RST_{CAPA}$. In this embodiment, a coupling capacitor COUPL is connected between node S' and node S.

The circuit of FIG. 2 operates as follows.

Before an integration phase, photodiode D is emptied of all the photogenerated charges which may be stored therein and the charge of capacitor CAPA is initialized. For this purpose, transistors $RST_{CAPA}$, TR, and RST are set to the on state. As a result, the photogenerated electrons stored in photodiode D are discharged towards potential Vdd by transistors TR and RST. This also results in that the potential on the terminal of capacitor CAPA which is connected to node S' is equal to ground potential GND, and that the potential on the other terminal of capacitor CAPA is equal to $V_{CAPA}$. Transistors $RST_{CAPA}$ and TR are then set back to the off state. The potential of node S' is then substantially equal to ground potential GND, and the potential of node S is equal to power supply potential Vdd.

During an integration phase, the photodiode receives light and electron-hole pairs are generated. The charges are stored in photodiode as long as the maximum storage capacity of the photodiode has not been reached. The case where the pixel is submitted to a strong illumination level such that, after a given time, the photodiode saturates, that is, it can no longer store photogenerated charges, is here considered. From the time when photodiode D saturates, although transistor TR is in the off state, the cathode potential of the photodiode is such that the excess electrons which can no longer be stored in the photodiode flow through transistor TR to node S connected to potential Vdd, the excess electrons then being drained away. At the same time, the excess photogenerated holes cause an increase in the potential of node S' and thus an increase the in charge of capacitor CAPA.

At the end of the integration phase, the quantity of electrons stored in photodiode D corresponds to the light received by photodiode D before saturation. Further, the potential variation of node S' between the beginning and the end of the integration phase corresponds to the number of charges photogenerated in saturated photodiode D, and thus to the light received by pixel 1 after saturation of photodiode D.

During a so-called hole reading phase, to know the charge increase of capacitor CAPA having occurred during the integration phase, pixel 1 is first selected by setting transistor RD to the on state, after which transistor RST is set to the off state. The potential of node S then is at a first level substantially equal to power supply potential Vdd. This first level is measured and stored via the read circuit of node S. Transistor $RST_{CAPA}$ is then set to the on state, and then to the off state, which cause a decrease in the potential of node S', and thus in the charge of capacitor CAPA. In this embodiment, due to the presence of coupling capacitor COUPL, the potential decrease of node S' causes a corresponding decrease in the potential of node S down to a second level which is measured and stored via the read circuit of node S. This second potential level is compared with the first potential level to deduce therefrom the charge variation of capacitor CAPA having occurred between the beginning and the end of the integration phase, and thus the number of charges which have been photogenerated while photodiode D was saturated.

During a so-called electron read phase, to know the number of photogenerated electrons stored in photodiode D, it is proceeded in conventional fashion by setting transistor RST to the on state, and then to the off state. The potential of node S then is at a third level, substantially equal to potential Vdd, which is measured and stored via the read circuit of node S. The electrons stored in photodiode D are then transferred to node S by setting transistor TR to the on state and then to the off state. The potential of node S then decreases to a fourth level which is measured and stored via the read circuit of node S. The fourth potential level is compared with the third potential level to deduce therefrom the number of photogenerated electrons which were stored in photodiode D. During the electron read phase, transistor $RST_{CAPA}$ is preferably set to the on state to set the potential of node S' to ground potential GND.

In the case where the illumination received during the integration phase causes no saturation of photodiode D, the reading of the holes will have provided a zero value, and the electron read phase will enable to measure the quantity of light received during the integration phase.

After the steps of reading the charges photogenerated in pixel 1, photodiode D is empty of any charge and the voltage across capacitor CAPA, and thus the charge thereof, has been set as previously indicated. Transistors $RST_{CAPA}$, TR, and RD are set back to the off state, transistor RST is set back to the on state, and a new integration cycle may start.

An advantage of pixel 1 is that capacitor CAPA enables to increase the quantity of photogenerated charges which may be stored in pixel 1 with respect to the case of the pixel of FIG. 1, without modifying the storage capacity of the photodiode of pixel 1 with respect to that of the pixel of FIG. 1. Thus, for photodiodes having similar storage capacities, and thus similar dimensions, pixel 1 has a higher dynamic range than the pixel of FIG. 1.

Another advantage of pixel 1 is that photodiode D and capacitor CAPA are directly connected to each other, with no interposition of another element such as a transistor. Indeed, the presence of a transistor might cause the lack of transmission of all the photogenerated charges to capacitor CAPA when the photodiode is saturated.

Another advantage of pixel 1 is, as will be seen hereafter, that it may be formed practically without modifying a conventional pixel.

In an alternative embodiment, an anti-blooming N-channel MOS transistor connected between the cathode of photodiode D and a high potential, for example, power supply potential Vdd, may be provided. The anti-blooming transistor is selected and controlled so that, during an integration phase, when the photodiode is saturated, the excess electrons flow through the anti-blooming transistor to potential Vdd, the electrons then being drained away from pixel 1. Further, the anti-blooming transistor may be set to the on state before an integration phase to empty photodiode D of all the charges that may be stored therein.

Figure 3:
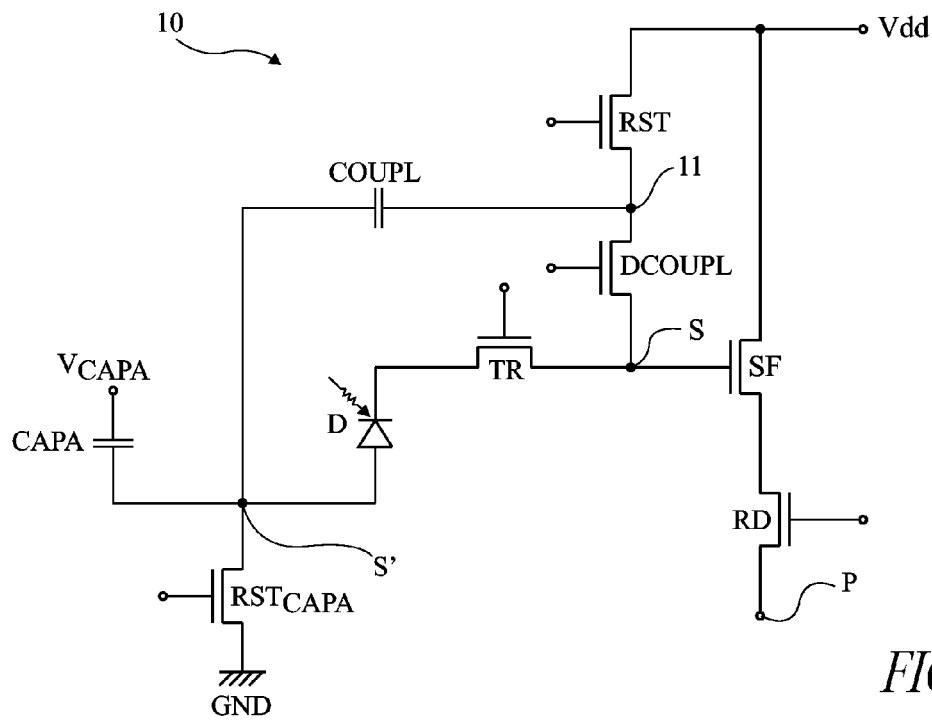
FIG. 3 illustrates an alternative embodiment of the pixel circuit of FIG. 2.

FIG. 3 illustrates an alternative embodiment of the pixel circuit of FIG. 2.

In this variation, a pixel 10 comprises the same elements designated with the same reference numerals as pixel 1. Pixel 10 further comprises an N-channel decoupling MOS transistor DCOUPL. Transistor DCOUPL is connected between sense node S and a node 11 of connection of transistor RST and of coupling capacitor COUPL.

In operation, during an integration phase, transistor DCOUPL is in the on state. During a hole reading phase, transistor DCOUPL is set to the on state and the hole reading phase is then carried out similarly to what has been described for pixel 1. During an electron reading phase which occurs as previously described, transistor DCOUPL is set to the off state and node S is then decoupled from capacitor COUPL. This enables to decrease the capacitance of node S during the electron reading phase, which results in a better sensitivity.

Figure 4:
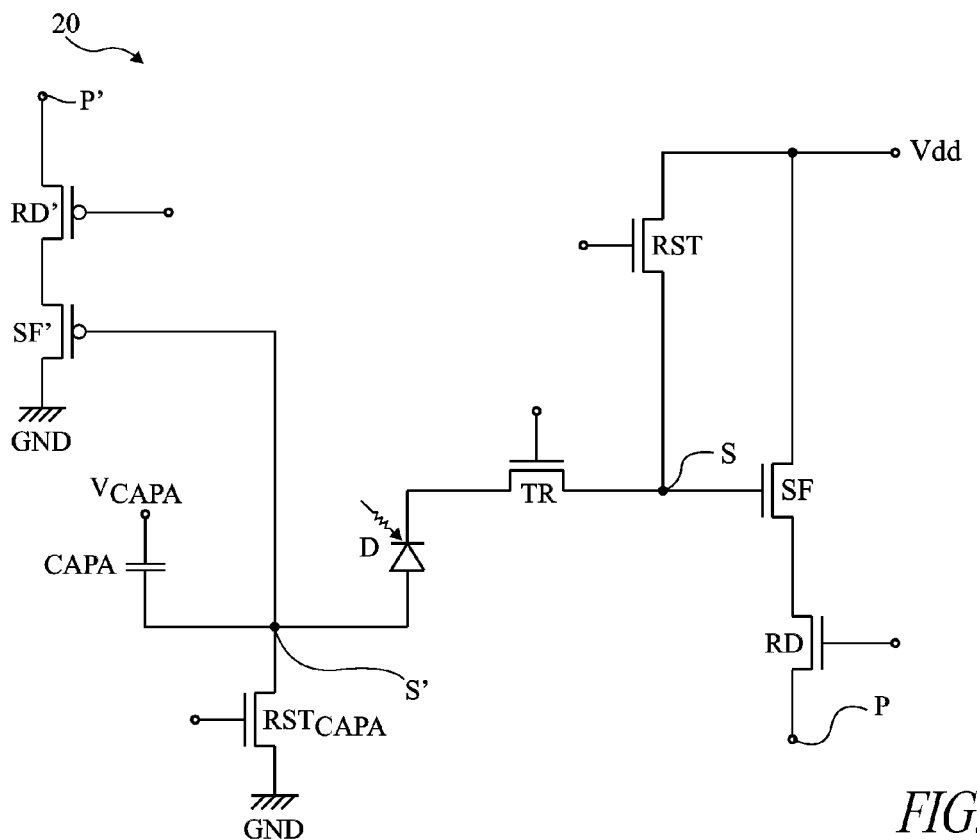
FIG. 4 illustrates another embodiment of the pixel circuit of FIG. 2.

FIG. 4 illustrates another alternative embodiment of the pixel circuit of FIG. 2.

In this variation, a pixel 20 comprises capacitor CAPA, photodiode D, transistors RST, TR, $RST_{CAPA}$, and the read circuit of node S (transistors SF and RD) connected together as in pixel 1. Unlike pixels 1 and 10, pixel 20 comprises no coupling capacitor COUPL but comprises two P-channel MOS transistors SF' and RD'. Transistors SF' and RD' are series-connected between ground potential GND and by a terminal P' to a processing circuit 70 (shown in FIG. 6), where the processing circuit 70 may be the same as that connected to terminal P. Transistor SF' is assembled as a source follower, its gate being connected to node S'. In an alternative embodiment, transistors RD' and SF' may be N-channel MOS transistors.

Thus, in pixel 20, storage node S' is associated with its own read circuit (transistors SF' and RD') unlike the case of pixels 1 and 10 where storage node S' is associated with the read circuit of node S by capacitor COUPL.

In operation, during an integration phase, transistor RD' is in the off state. During a hole reading phase, pixel 20 is selected by setting transistor RD' to the on state while transistor $RST_{CAPA}$ is in the off state, and a first potential level of node S' is measured and stored via the read circuit of node S' (transistors RD' and SF'). Then, transistor $RST_{CAPA}$ is set to the on state, and then to the off state, which causes a decrease in the potential of node S' down to a second level substantially equal to potential GND, and thus a decrease in the charge of capacitor CAPA. This second potential level is measured, stored, and compared with the first potential level to deduce therefrom the number of charges having been photogenerated during the integration phase when photodiode D was saturated. Transistor RD' is set back to the off state, after which the electron reading phase occurs similarly to what has been described for pixels 1 and 10.

An embodiment of a pixel 30 of the type described in relation with FIGS. 2 to 4 will now be described in relation with FIGS. 5A and 5B, FIG. 5A being a top view of pixel 30 and FIG. 5B being a cross-section view along plane BB of FIG. 5A.

A pixel structure having all its elements or technological bricks individually known, these elements being specifically arranged, is here used. Thus, pixel 30 may be formed by using tried and tested techniques and is no bigger than a conventional pixel.

Pixel 30 is formed inside and on top of a semiconductor layer 31, for example, a single-crystal silicon layer of SOI type. Pixel 30 comprises a photodiode D comprising a P-type doped well 33 delimited along its entire periphery by an insulated trench (insulating layer 35) filled with a conductive material 37, or insulated conductive wall 37. A buried layer of region 39 (in dotted lines in FIG. 5A), N-type doped, is formed in P well 33. Region 39 does not extend laterally all the way to insulated conductive wall 37. Well 33 and insulated conductive wall 37 extend all throughout the thickness of layer 31 so that P well 33 is electrically insulated from the rest of layer 31. In this example, insulated conductive wall 37 and P well 33 extend from the upper surface of semiconductor layer 31 to an insulating layer 41 formed on the lower surface of layer 31 and resting on a semiconductor layer 43. P well 33 and N region 39 respectively correspond to the cathode and the anode of photodiode D, photodiode D being of pinned type. The doping levels of P well 33 and of N region 39 are selected so that, in the absence of illumination, N region 39 is fully depleted.

Pixel 30 comprises transfer transistor TR of FIGS. 2 to 4. This transistor comprises a heavily-doped N-type region 45 ($N^+$) formed in P well 33, at the level of the upper surface thereof. $N^+$ region 45 corresponds to sense node S of FIGS. 2 to 4. Gate 47 of transistor TR is formed on the upper surface of P well 33, above a portion of P well 33 extending between N region 39 and $N^+$ region 45.

A heavily-doped P-type contacting area 51 ($P^+$) is formed in P well 33, at the level of the upper surface thereof.

Although this has not been shown, transistors RST, $RST_{CAPA}$, RD, SF, and possibly transistor DCOUPL or transistors RD' and SF' are formed inside and on top of semiconductor layer 31, outside of well 33 delimited by a conductive wall 37. These transistors are for example formed in a portion of semiconductor layer 31 extending between the P wells 33 of neighboring pixels.

An interconnection structure (shown schematically by lines connected to $V_{CAPA}$, S, and S') is provided on the upper surface of layer 31 to connect the drains, sources, and gates of the various transistors as described in relation with FIG. 2, 3, or 4. In particular, the interconnection structure enables to connect insulated conductive wall 37 to a source of above-mentioned potential $V_{CAPA}$, and enables to connect $P^+$ region 51 to reset transistor $RST_{CAPA}$, $P^+$ region 51 then corresponding to storage node S' of FIGS. 2 to 4.

Thus, the capacitance formed of P well 33, of insulating layer 35, and of conductive material 37 corresponds to capacitor CAPA of FIGS. 2 to 4. This capacitor may have a capacitance greater than 50 fF, for example, in the range from 100 to 300 fF, for a pixel having a surface area in the range from 1 to 5 $\mu m^2$. Advantageously, due to its structure, capacitor CAPA does not cause an increase in the pixel dimensions.

In the case where pixel 30 corresponds to one of the circuits of pixel 1 or 10, a capacitor COUPL (not shown) is formed in the interconnection structure of pixel 30. Conversely to the case of capacitor CAPA which should have a high capacitance to be able to store a large number of photogenerated charges and increase the pixel dynamic range, capacitor COUPL is not intended to store photogenerated charges and should preferably have a low capacitance. This capacitance is for example in the range from 1 to 5 fF. Thus, advantageously, the forming of capacitor COUPL of low capacitance in the interconnection structure causes no increase in the dimensions of pixel 30.

In operation, before an integration phase, P well 33 and N region 39 are emptied of all the photogenerated charges which should be stored therein by coupling of $N^+$ region 45 (node S) and of $P^+$ region 51 (node S') to respective potentials Vdd and GND as described in relation with FIGS. 2 to 4. N region 39 and a portion of P well 33 bordering N region 39 are then depleted.

During the integration phase, electron-hole pairs are photogenerated in photodiode D, which results in that N region 39 and the region of P well 33 bordering N region 39 are less and less depleted. As long as the photodiode is not saturated, the charge generation causes no increase in the potential of P well 33, and thus of $P^+$ region 51 (node S'). After some time, if the illumination received by the pixel is too strong, N region 39 and the region of P well 33 bordering N region 39 are no longer depleted. Photodiode D is then saturated and the photogenerated electrons can no longer be stored in N region 39. The excess electrons photogenerated in photodiode D flow towards $N^+$ region 45 (node S) coupled to potential Vdd, and are drained away from photodiode D. At the same time, the excess photogenerated holes are then attracted along insulating layer 35 due to the fact that insulated conductive wall 37 is at negative potential $V_{CAPA}$. Such an accumulation of holes causes an increase in the charge of capacitor CAPA, and thus in the potential of $P^+$ region 51 (node S').

The hole reading phase and the electron reading phase are then carried out as described in relation with FIGS. 2 to 4.

As an example, the thickness of the semiconductor layer is smaller than 10 µm, preferably in the range from 3 to 6 µm. Conductive material 37 may be doped polysilicon or a metal. Insulating layer 35 may be a silicon oxide layer or correspond to a succession of insulating layers, for example, made of silicon oxide, of silicon nitride, and of silicon oxide. The doping level of P well 33 may be in the range from $10^{15}$ to $10^{18}$ at·cm$^{-3}$, for example, $10^{16}$ at·cm$^{-3}$. The doping level of N region 39 may be in the range from $10^{15}$ to $10^{18}$ at·cm$^{-3}$, for example, $10^{17}$ at·cm$^{-3}$. The doping level of $N^+$ region 45 may be greater than $10^{19}$ at·cm$^{-3}$, for example, equal to $10^{20}$ at·cm$^{-3}$. The doping level of $P^+$ region 51 may be greater than $10^{18}$ at·cm$^{-3}$, for example, equal to $5*10^{18}$ at·cm$^{-3}$. Potential Vdd may be in the order of 3 V.

Photodiode D may for example store at most from 6,000 to 10,000 photogenerated electrons. Capacitor CAPA may for example enable to accumulate up to one million holes along insulating layer 35, on the side of P well 33, whereby the dynamic range of pixel 30 is approximately 100 times higher than that of a pixel of the type in FIG. 1 having same dimensions as pixel 30.

Various embodiments with different variations have been described hereabove. It will be within the abilities of those skilled in the art to combine various elements of these various embodiments and variations, without showing any inventive step. Further, variations, modifications, and improvements will readily occur to those skilled in the art.

In particular, the levels of the potentials having the various transistors and capacitors of the previously-described pixels connected thereto may be adapted by those skilled in the art. For example, in the case where an anti-blooming transistor is provided, the latter may be connected between the cathode of photodiode D and a high potential different from power supply potential Vdd.

Transistor $RST_{CAPA}$ may be a P-channel MOS transistor.

In the above-described pixels, all charge carriers types and all conductivity types may be inverted. It will then be within the abilities of those skilled in the art to adapt the potentials applied to the various elements and regions of these pixels.

Figure 5A:
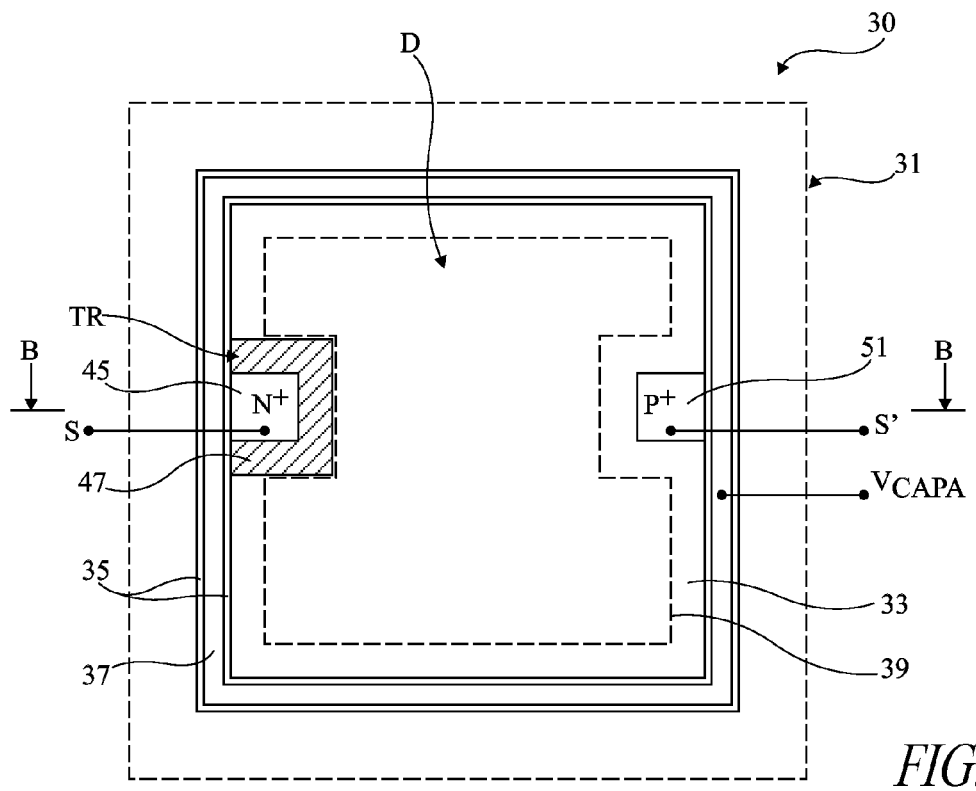
FIGS. 5A and 5B illustrate an embodiment of a pixel of the type in FIGS. 2 to 4.
Figure 5B:
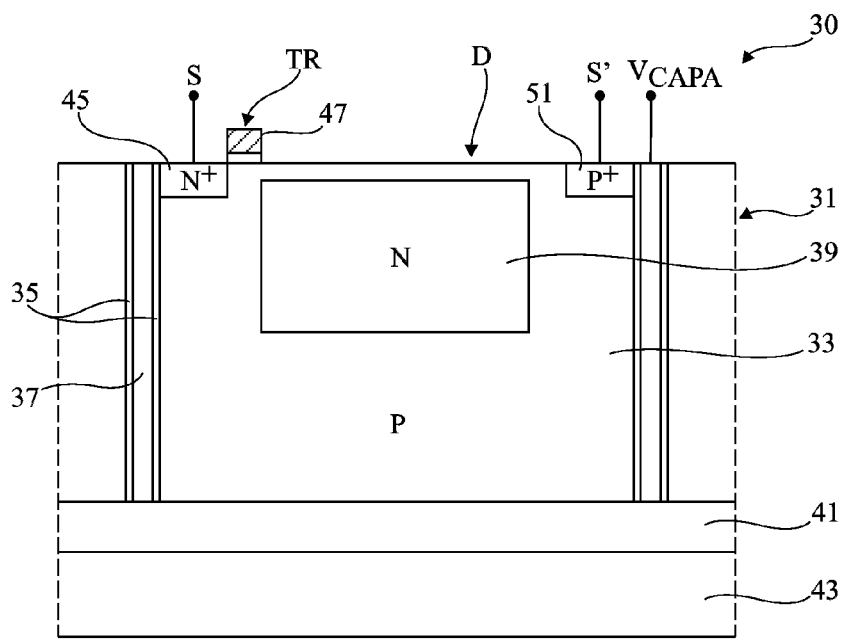

Although this has not been specified, it should be understood that a pixel of the type in FIGS. 5A-5B may be capable of receiving an illumination on the upper surface side or on the lower surface side of layer 31. It may be provided for a color filter and/or a lens to be formed on the side of the surface of layer 31 intended to receive an illumination. Further, a heavily-doped P-type layer ($P^+$) may be arranged at the level of the surface of P well 33 intended to receive an illumination.

Figure 6:
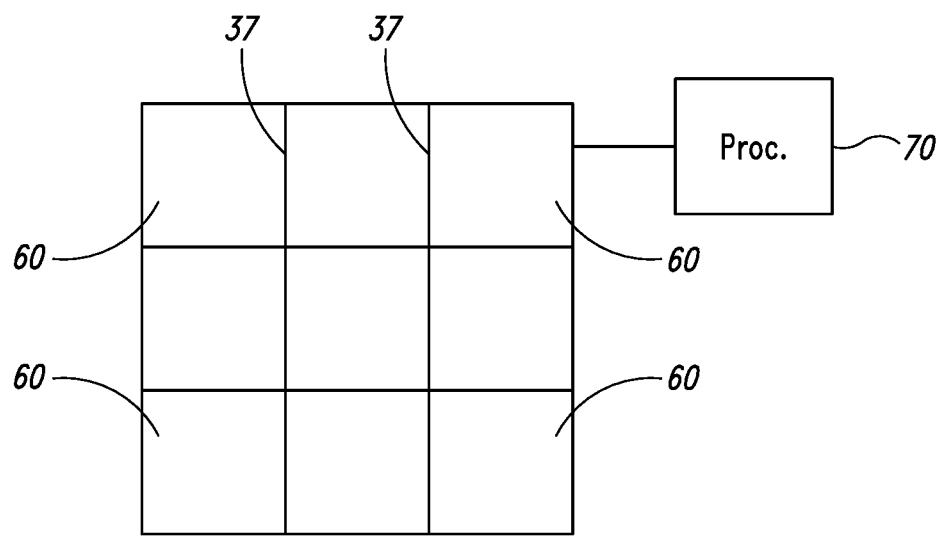
FIG. 6 is a schematic diagram of an image sensor including an array of pixels.

Shown schematically in FIG. 6 is an image sensor that includes an array of pixels 60, each of which may be implemented by one of the pixels 1, 10, 20, and 30 shown in FIGS. 2-5B. FIG. 6 shows the insulated conductive walls 37 delimiting the pixels 60 from each other and shows the processing circuit 70 that is connected to the terminals P, and connected to the terminals P' if the pixel 20 is employed as the pixels 60.

Read circuits of node S different from that previously described may be provided in the pixels described in relation with FIGS. 2 to 5A-5B. Further, although examples of operation of these pixels during which the hole reading phase is carried out before the electron reading phase have been described, the reading order may be inverted.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pixel comprising:
    a transfer MOS transistor formed in a semiconductor region having a first conductivity type;
    a storage capacitor formed in the semiconductor region;
    a read circuit; and
    a photodiode having a first pole corresponding to a semiconductor region having a second conductivity type coupled through the transfer MOS transistor to a sense node for sensing charges of a first type stored in the photodiode, and having a second pole corresponding to a semiconductor region having the first conductivity type connected through a contact region having the first conductivity type to the storage capacitor and to the read circuit, wherein the read circuit is configured to sense charges of a second type provide from the second pole to the storage capacitor.

2. The pixel of claim 1, comprising:
a first semiconductor region of a first conductivity type;
an insulated semiconductor well of the second conductivity type, the first semiconductor region being formed in the well, the first semiconductor region and well comprising the photodiode;
a conductive wall surrounding the well;
an insulating layer coating the conductive wall and delimiting the well, the storage capacitor including the conductive wall, the insulating layer, and the well;
a heavily-doped second semiconductor region of the second conductivity type formed at a level of a surface of the well and connected to the read circuit; and
a heavily-doped third semiconductor region of the first conductivity type formed at the level of said surface of the well and connected to the sense node; wherein:
the transfer transistor has a gate formed on said surface of the well and is configured to selectively allow or block a transfer of charges of the first type from the first region to the third region.

3. The pixel of claim 2, comprising an interconnection structure formed on said surface of the well, the coupling capacitor being formed in the interconnection structure.

4. The pixel of claim 2, comprising another insulating layer delimiting a lower surface of the well.

5. The pixel of claim 1, further comprising a reset MOS transistor electrically coupled to the second pole of the photodiode.

6. The pixel of claim 1, further comprising a precharge MOS transistor electrically coupled to the sense node.

7. The pixel of claim 1, further comprising an anti-blooming MOS transistor electrically coupled to the first pole of the photodiode.

8. The pixel of claim 1, wherein the read circuit comprises a coupling capacitor connected between the second pole of the photodiode and the sense node.

9. The pixel of claim 1, wherein the read circuit comprises a coupling capacitor and a decoupling transistor electrically coupled to each other between the second pole of the photodiode and the sense node.

10. The pixel of claim 1, wherein the read circuit comprises a read MOS transistor, a terminal of the storage capacitor being connected to the second pole of the photodiode and to a gate of the read MOS transistor.

11. An image sensor comprising:
a plurality of pixels formed in a semiconductor layer having a first conductivity type, each pixel including:
a transfer MOS transistor;
a storage capacitor;
a photodiode having a first semiconductor region having a second conductivity type opposite that of the first conductivity type formed in the semiconductor layer and being coupled through the transfer MOS transistor to a sense node for sensing charges of a first type stored in the photodiode, and the photodiode having a second semiconductor region having the first conductivity type connected through a contact region having the first conductivity type formed in the semiconductor layer to the storage capacitor; and
a read circuit connected to the second semiconductor region, the read circuit including a coupling capacitor electrically coupled between a node and the storage capacitor and including a decoupling transistor electrically coupled between the node and the sense node, and the read circuit configured to sense charges of a second type transferred from the second semiconductor region of the photodiode to the storage capacitor.

12. The image sensor of claim 11, wherein each pixel includes a reset MOS transistor electrically coupled to the second pole of the photodiode.

13. The image sensor of claim 11, wherein each pixel includes a precharge MOS transistor electrically coupled to the sense node.

14. The image sensor of claim 11, wherein each pixel includes an anti-blooming MOS transistor electrically coupled to the first pole of the photodiode.

15. The image sensor of claim 11, wherein the read circuit comprises a coupling capacitor connected between the second pole of the photodiode and the sense node.

16. The image sensor of claim 11, wherein the read circuit comprises a read MOS transistor, a terminal of the storage capacitor being connected to the second pole of the photodiode and to a gate of the read MOS transistor.

17. A pixel comprising:
a photodiode formed in a semiconductor region and configured to store charges of a first type in response to being illuminated, the photodiode having first and second nodes;
a transfer MOS transistor that selectively couples the first node of the photodiode to a sense node for sensing the charges of a first type stored in the photodiode;
a storage capacitor connected through a contact region formed in the semiconductor region to the second node of the photodiode, the contact region and the semiconductor region having the same conductivity type and the storage capacitor being configured to receive charges of a second type from the second node of the photodiode; and
a read circuit configured to read the charges of the second type from the storage capacitor.

18. The pixel of claim 17, comprising:
a first semiconductor region of a first conductivity type;
an insulated semiconductor well of the second conductivity type, the first semiconductor region being formed in the well, the first semiconductor region and well comprising the photodiode;
a conductive wall surrounding the well;
an insulating layer coating the conductive wall and delimiting the well, the storage capacitor including the conductive wall, the insulating layer, and the well;
a heavily-doped second semiconductor region of the second conductivity type formed at a level of a surface of the well and connected to the read circuit; and
a heavily-doped third semiconductor region of the first conductivity type formed at the level of said surface of the well and connected to the sense node; wherein:
the transfer transistor has a gate formed on said surface of the well and is configured to selectively allow or block a transfer of charges of the first type from the first region to the third region.

19. The pixel of claim 18, comprising another insulating layer delimiting a lower surface of the well.

* * * * *